(12) United States Patent
Chang et al.

(10) Patent No.: US 9,819,348 B2
(45) Date of Patent: Nov. 14, 2017

(54) OSCILLATOR, A CLOCK GENERATOR AND A METHOD FOR GENERATING A CLOCK SIGNAL

(71) Applicant: Novatek Microelectronics Corp., Hsinchu (TW)

(72) Inventors: Chih-Hsiang Chang, Hsinchu (TW); Chih-Hung Chen, Kaohsiung (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 14/829,657

(22) Filed: Aug. 19, 2015

(65) Prior Publication Data
US 2016/0126959 A1    May 5, 2016

Related U.S. Application Data

(60) Provisional application No. 62/074,091, filed on Nov. 3, 2014.

(30) Foreign Application Priority Data

Jul. 13, 2015   (TW) .............................. 104122492 A

(51) Int. Cl.
| | |
|---|---|
| H03B 5/04 | (2006.01) |
| H03B 5/12 | (2006.01) |
| H03L 1/02 | (2006.01) |
| H03L 1/00 | (2006.01) |

(52) U.S. Cl.
CPC ............. *H03L 1/022* (2013.01); *H03B 5/04* (2013.01); *H03B 5/1215* (2013.01);
(Continued)

(58) Field of Classification Search
CPC ... H03B 5/04; H03B 5/08; H03B 5/12; H03B 5/1206; H03B 5/1209; H03B 5/1212;
(Continued)

(56) References Cited

U.S. PATENT DOCUMENTS

| | | | |
|---|---|---|---|
| 5,912,596 A * | 6/1999 | Ghoshal ............... | H03K 3/0322 331/108 B |
| 7,061,340 B2 * | 6/2006 | Boccuzzi ............. | H03B 5/1228 331/117 FE |

(Continued)

OTHER PUBLICATIONS

"Office Action of Taiwan Counterpart Application," dated Jun. 21, 2016, p. 1-p. 8.

*Primary Examiner* — Levi Gannon
(74) *Attorney, Agent, or Firm* — JCIPRNET

(57) ABSTRACT

An oscillator configured to generate an oscillation signal is provided. The oscillator includes a transistor pair and a cross-coupled transistor pair. The transistor pair is coupled to a first current source and has a first transconductance. The first transconductance is changed in response to a current value of the first current source. The cross-coupled transistor pair is coupled to a second current source and has a second transconductance. The second transconductance is changed in response to a current value of second current source. The transistor pair and the cross-coupled transistor pair are mutually coupled by a plurality of inductors. A frequency of the oscillation signal is determined according to the first transconductance and the second transconductance. Furthermore, a clock generator and a method for generating a clock signal thereof are also provided.

19 Claims, 6 Drawing Sheets

(52) U.S. Cl.
CPC ......... *H03B 5/1225* (2013.01); *H03B 5/1228* (2013.01); *H03B 5/1237* (2013.01); *H03B 5/1271* (2013.01); *H03B 5/1296* (2013.01); *H03L 1/00* (2013.01); *H03B 2200/0038* (2013.01)

(58) Field of Classification Search
CPC .. H03B 5/1215; H03B 5/1221; H03B 5/1225; H03B 5/1237; H03B 5/1271; H03B 5/1296; H03L 1/00; H03L 1/02; H03L 1/021; H03L 1/022
USPC ........ 331/66, 117 FE, 117 R, 167, 176, 185, 331/186
See application file for complete search history.

(56) References Cited

U.S. PATENT DOCUMENTS

| | | | | |
|---|---|---|---|---|
| 7,098,737 B2* | 8/2006 | Fujimoto | ............. | H03B 5/1841 330/283 |
| 7,239,209 B2* | 7/2007 | Adan | ..................... | H03B 27/00 331/117 FE |
| 7,342,464 B2* | 3/2008 | Hino | ..................... | H03C 3/227 331/108 C |
| 7,532,001 B2* | 5/2009 | Lee | ..................... | H03B 5/1228 324/127 |
| 7,551,038 B2* | 6/2009 | Jang | ..................... | H03B 27/00 331/117 FE |
| 7,649,424 B2* | 1/2010 | Cusmai | ................. | H03B 27/00 331/117 FE |
| 8,035,457 B2* | 10/2011 | Chang | ................. | H03B 5/1225 331/117 FE |
| 8,125,282 B2* | 2/2012 | Bao | ..................... | H03B 5/1852 331/107 SL |
| 9,041,477 B2* | 5/2015 | Lu | ........................ | H03B 5/1228 331/117 FE |
| 2007/0222489 A1* | 9/2007 | Kousai | ..................... | H03L 5/00 327/156 |
| 2008/0007366 A1* | 1/2008 | Bevilacqua | .......... | H03B 5/1228 331/179 |
| 2011/0018645 A1 | 1/2011 | Chang et al. | | |

* cited by examiner

OSCILLATOR, A CLOCK GENERATOR AND A METHOD FOR GENERATING A CLOCK SIGNAL

CROSS-REFERENCE TO RELATED APPLICATION

This application claims the priority benefits of U.S. provisional application Ser. No. 62/074,091, filed on Nov. 3, 2014 and Taiwan application serial no. 104122492, filed on Jul. 13, 2015. The entirety of each of the above-mentioned patent applications is hereby incorporated by reference herein and made a part of this specification.

BACKGROUND OF THE INVENTION

Field of the Invention

The invention relates to an electronic circuit element, a signal generator and a method for generating a signal, and particularly relates to an oscillator, a clock generator and a method for generating a clock signal.

Description of Related Art

An oscillator is an important component in many electronic systems, and may be applied in varies electronic circuit devices. It is very important for an oscillator to output an oscillation signal with accurate and stable frequency. Regarding a current oscillator applied to an electronic circuit, common factors that may affect the oscillation frequency include temperature variation, process variation and electromagnetic interference, etc., and such factors may cause a frequency drift to influence accuracy and stableness of the frequency. According to the conventional technique, a method for resolving the above problem is to adjust a capacitance of a varactor in the oscillator to compensate the drifted oscillation frequency, so as to maintain the accuracy and stableness of the oscillation frequency. However, the varactor is liable to produce a non-ideal second order effect or produce a parasitic capacitance in a high frequency circuit, and such problem may influence an operation of the circuit component and reliability thereof.

SUMMARY OF THE INVENTION

The invention is directed to an oscillator, in which a cross-coupled transistor pair and another transistor pair in the oscillator are mutually coupled through a plurality of inductors, so as to generate an oscillation signal.

The invention is directed to a clock generator including the aforementioned oscillator, which is configured to generate a clock signal.

The invention is directed to a method for generating a clock signal, which is configured to control the aforementioned oscillator to generate an oscillation signal to serve as the clock signal.

The invention provides an oscillator configured to generate an oscillation signal. The oscillator includes a transistor pair and a cross-coupled transistor pair. The transistor pair is coupled to a first current source and has a first transconductance. The first transconductance is changed in response to a current value of the first current source. The cross-coupled transistor pair is coupled to a second current source and has a second transconductance. The second transconductance is changed in response to a current value of the second current source. The transistor pair and the cross-coupled transistor pair are mutually coupled through a plurality of inductors. A frequency of the oscillation signal is determined according to the first transconductance and the second transconductance.

In an embodiment of the invention, the oscillator is a crystal-free oscillator.

In an embodiment of the invention, the oscillator is a voltage-controlled oscillator. The voltage-controlled oscillator is configured to generate the oscillation signal according to an input voltage. The current value of at least one of the first current source and the second current source is adjusted according to the input voltage.

In an embodiment of the invention, the inductors include a first inductor and a second inductor. The transistor pair includes a first transistor and a second transistor. The first transistor has a first terminal, a second terminal and a control terminal. The first terminal is coupled to the first inductor. The second terminal is coupled to the first current source. The control terminal is coupled to the cross-coupled transistor pair. The second transistor has a first terminal, a second terminal and a control terminal. The first terminal is coupled to the second inductor. The second terminal is coupled to the first current source. The control terminal is coupled to the cross-coupled transistor pair. At least one of the first terminal of the first transistor and the first terminal of the second transistor serves as an output terminal. The oscillator outputs the oscillation signal through the output terminal.

In an embodiment of the invention, the inductors further include a third inductor and a fourth inductor. The cross-coupled transistor pair includes a third transistor and a fourth transistor. The third transistor has a first terminal, a second terminal and a control terminal. The first terminal is coupled to the third inductor and the control terminal of the first transistor, and the second terminal is coupled to the second current source. The fourth transistor has a first terminal, a second terminal and a control terminal. The first terminal is coupled to the fourth inductor and the control terminal of the second transistor, and the second terminal is coupled to the second current source. The control terminal of the third transistor is coupled to the first terminal of the fourth transistor, and the control terminal of the fourth transistor is coupled to the first terminal of the third transistor.

In an embodiment of the invention, the first inductor and the third inductor form a first mutual inductor. The second inductor and the fourth inductor form a second mutual inductor. The first mutual inductor and the second mutual inductor are physically isolated.

In an embodiment of the invention, the current value of at least one of the first current source and the second current source is adjusted according to a temperature parameter.

In an embodiment of the invention, the oscillator further includes a temperature sensor circuit. The temperature sensor circuit is coupled to at least one of the first current source and the second current source. The temperature sensor circuit is configured to sense the temperature parameter, and adjusts the current value of at least one of the first current source and the second current source according to the temperature parameter.

In an embodiment of the invention, the temperature sensor circuit adjusts the current value of at least one of the first current source and the second current source by using at least one of a third current source and a fourth current source.

In an embodiment of the invention, the third current source is selected from one of a current source proportional to absolute temperature (PTAT) and a current source complementary to absolute temperature (CTAT). The fourth current source is selected from another one of the current source proportional to absolute temperature and the current source complementary to absolute temperature.

In an embodiment of the invention, the current value of at least one of the first current source and the second current source is adjusted according to a process parameter.

In an embodiment of the invention, the oscillator further includes a compensation circuit. The compensation circuit is coupled to at least one of the first current source and the second current source. The compensation circuit is configured to receive a compensation signal, and outputs a compensation current according to the compensation signal, so as to adjust the current value of at least one of the first current source and the second current source.

The invention provides a clock generator configured to generate a clock signal. The clock generator includes an oscillator. The oscillator is configured to generate an oscillation signal to serve as the clock signal. The oscillator includes a transistor pair and a cross-coupled transistor pair. The transistor pair is coupled to a first current source and has a first transconductance. The first transconductance is changed in response to a current value of the first current source. The cross-coupled transistor pair is coupled to a second current source and has a second transconductance. The second transconductance is changed in response to a current value of the second current source. The transistor pair and the cross-coupled transistor pair are mutually coupled through a plurality of inductors. A frequency of the oscillation signal is determined according to the first transconductance and the second transconductance.

The invention provides a method for generating a clock signal, which is configured to control an oscillator to generate an oscillation signal to serve as a clock signal. The oscillator includes a transistor pair and a cross-coupled transistor pair. The method for generating the clock signal includes following steps. A first transconductance of the transistor pair is determined according to a first current source, and a second transconductance of the cross-coupled transistor pair is determined according to a second current source. A frequency of the oscillation signal is determined according to the first transconductance and the second transconductance. The transistor pair and the cross-coupled transistor pair are mutually coupled through a plurality of inductors. The transistor pair is coupled to the first current source. The first transconductance is changed in response to a current value of the first current source. The cross-coupled transistor pair is coupled to the second current source. The second transconductance is changed in response to a current value of the second current source.

In an embodiment of the invention, the oscillator is a crystal-free oscillator.

In an embodiment of the invention, the oscillator is a voltage-controlled oscillator configured to generate the oscillation signal according to an input voltage. The step of determining the first transconductance of the transistor pair according to the first current source, and determining the second transconductance of the cross-coupled transistor pair according to the second current source includes adjusting the current value of at least one of the first current source and the second current source according to the input voltage, so as to correspondingly change at least one of the first transconductance of the transistor pair and the second transconductance of the cross-coupled transistor pair.

In an embodiment of the invention, the step of adjusting the current value of at least one of the first current source and the second current source according to the input voltage, so as to correspondingly change at least one of the first transconductance of the transistor pair and the second transconductance of the cross-coupled transistor pair includes at least one of two following steps. The current value of the first current source is adjusted to change the first transconductance of the transistor pair. The current value of the second current source is adjusted to change the second transconductance of the cross-coupled transistor pair.

In an embodiment of the invention, the inductors include a first inductor, a second inductor, a third inductor and a fourth inductor. The first inductor and the third inductor form a first mutual inductor. The second inductor and the fourth inductor form a second mutual inductor. The first mutual inductor and the second mutual inductor are physically isolated.

In an embodiment of the invention, the method for generating the clock signal further includes generating a temperature parameter, and using at least one of a third current source and a fourth current source to adjust the current value of at least one of the first current source and the second current source according to the temperature parameter.

In an embodiment of the invention, the third current source is selected from one of a current source proportional to absolute temperature (PTAT) and a current source complementary to absolute temperature (CTAT). The fourth current source is selected from another one of the current source proportional to absolute temperature (PTAT) and the current source complementary to absolute temperature (CTAT).

In an embodiment of the invention, the method for generating the clock signal further includes receiving a compensation signal, and outputting a compensation current according to the compensation signal, so as to adjust the current value of at least one of the first current source and the second current source.

According to the above descriptions, in the exemplary embodiments of the invention, the oscillator is configured to output an oscillation signal, which is used in the clock generator to serve as a clock signal. The cross-coupled transistor pair and the transistor pair are mutually coupled through a plurality of inductors. The frequency of the oscillation signal is determined by the first transconductance and the second transconductance, so as to generate the oscillation signal.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

A plurality of embodiments are provided below to describe the disclosure, though the disclosure is not limited to the provided embodiments, and the embodiments may also be suitably combined. A term "couple" used in the full text of the disclosure (including the claims) refers to any direct and indirect connections. For example, if a first device is described to be coupled to a second device, it is interpreted as that the first device is directly coupled to the second device, or the first device is indirectly coupled to the second device through other devices or connection means. Moreover, a term "signal" refers to at least a current, a voltage, an electric charge, a temperature, data or any other one or a plurality of signals.

Figure 1:
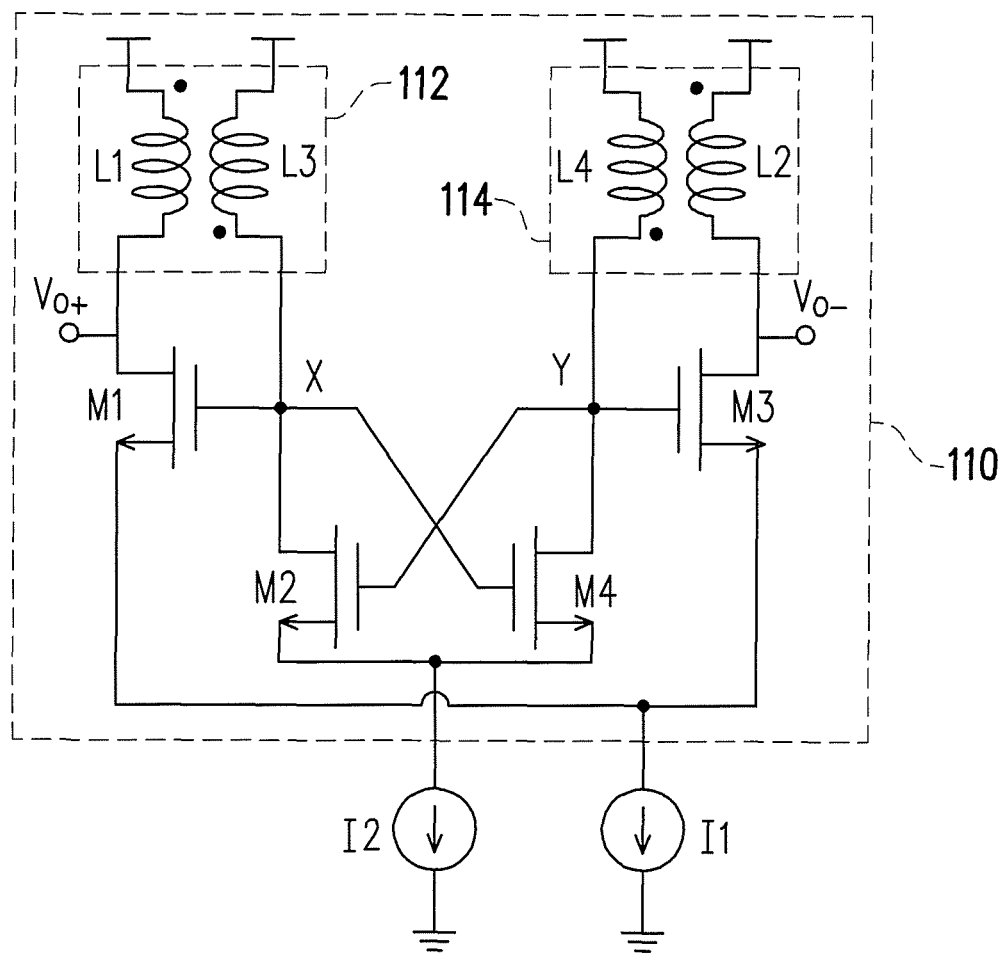
FIG. 1 is a circuit schematic diagram of an oscillator according to an embodiment of the invention.

FIG. 1 is a circuit schematic diagram of an oscillator according to an embodiment of the invention. Referring to FIG. 1, the oscillator 110 of the present embodiment includes a transistor pair M1, M3 and a cross-coupled transistor pair M2, M4, a first mutual inductor 112 and a second mutual inductor 114. In the present embodiment, the transistor pair M1, M3 is coupled to a first current source I1. The cross-coupled transistor pair M2, M4 is coupled to a second current source I2. The first mutual inductor 112 includes a first inductor L1 and a third inductor L3, and the second mutual inductor 114 includes a second inductor L2 and a fourth inductor L4. The first mutual inductor 112 and the second mutual inductor 114 are physically isolated, and none mutual inductance value exists therebetween. In the present embodiment, the cross-coupled transistor pair M2, M4 and the transistor pair M1, M3 are mutually coupled through a plurality of the inductors L1 to L4.

Figure 8:
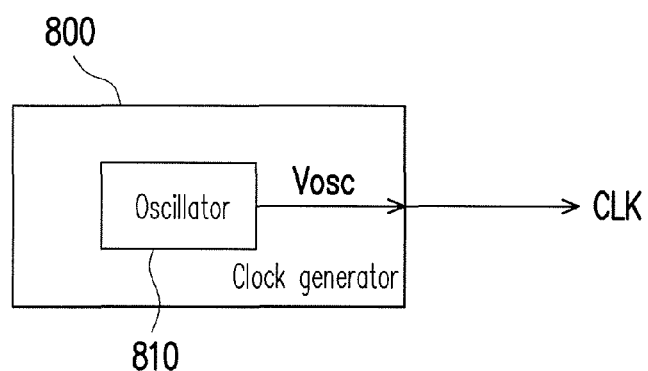
FIG. 8 is a circuit schematic diagram of a clock generator according to an embodiment of the invention.

To be specific, in the present embodiment, the transistor pair M1, M3 includes a first transistor M1 and a second transistor M3. The first transistor M1 has a first terminal, a second terminal and a control terminal. In the present embodiment, the first transistor M1 is, for example, an n-channel metal-oxide-semiconductor field-effect transistor (NMOSFET), so that the first terminal, the second terminal and the control terminal thereof are respectively a drain, a source and a gate of the NMOS transistor, though the invention is not limited thereto. In the present embodiment, the first terminal of the first transistor M1 is coupled to the first inductor L1. The second terminal of the first transistor M1 is coupled to the first current source I1. The control terminal of the first transistor M1 is coupled to the cross-coupled transistor pair M2, M4 through a node X. The second transistor M3 has a first terminal, a second terminal and a control terminal. Similar to the first transistor M1, in the exemplary embodiment of the NMOS transistor, the first terminal, the second terminal and the control terminal of the second transistor M3 are respectively a drain, a source and a gate of the NMOS transistor, though the invention is not limited thereto. The first terminal of the second transistor M3 is coupled to the second inductor L2. The second terminal of the second transistor M3 is coupled to the first current source I1. The control terminal of the second transistor M3 is coupled to the cross-coupled transistor pair M2, M4 through a node Y. In the present embodiment, the first terminal of the first transistor M1 and the first transistor of the second transistor M3 respectively serve as output terminals Vo+, Vo− of the oscillator 110. The oscillator 110 outputs an oscillation signal Vosc through the output terminals Vo+, Vo−, as shown in FIG. 8. In the present embodiment, the oscillation signal Vosc is, for example, a differential signal, so that the first terminal of the first transistor M1 and the first transistor of the second transistor M3 respectively serve as the output terminals Vo+, Vo− of the oscillator 110. In an exemplary embodiment, the oscillator 110 may be a single-end output, which is not limited by the invention. In the exemplary embodiment of the single-end output, the first terminal of the first transistor M1 and the first terminal of the second transistor M3 are taken as the output terminal of the oscillator 110, which is determined according to an actual circuit design.

On the other hand, the cross-coupled transistor pair M2, M4 includes a third transistor M2 and a fourth transistor M4. The third transistor M2 has a first terminal, a second terminal and a control terminal. Similar to the first transistor M1, in the exemplary embodiment of the NMOS transistor, the first terminal, the second terminal and the control terminal of the third transistor M2 are respectively a drain, a source and a gate of the NMOS transistor, though the invention is not limited thereto. The first terminal of the third transistor M2 is coupled to the third inductor L3 and the control terminal of the first transistor M1 through the node X, and the second terminal of the third transistor M2 is coupled to the second current source I2. The fourth transistor M4 has a first terminal, a second terminal and a control terminal. Similar to the first transistor M1, in the exemplary embodiment of the NMOS transistor, the first terminal, the second terminal and the control terminal of the fourth transistor M4 are respectively a drain, a source and a gate of the NMOS transistor, though the invention is not limited thereto. The first terminal of the fourth transistor M4 is coupled to the fourth inductor L4 and the control terminal of the second transistor M3 through the node Y. The second terminal of the fourth transistor M4 is coupled to the second current source I2. In the present embodiment, in the cross-coupled transistor pair M2, M4, the control terminal of the third transistor M2 is coupled to the first terminal of the fourth transistor M4, and the control terminal of the fourth transistor M4 is coupled to the first terminal of the third transistor M2.

In the present embodiment, although the transistors M1-M4 are implemented by the NMOS transistors, the invention is not limited thereto. In an embodiment, the transistors M1-M4 may also be implemented by p-channel metal-oxide-semiconductor field-effect transistor (PMOSFET). By using the PMOS transistors, a layout of the other circuit components in the oscillator 110 may be adaptively adjusted, and since enough instructions and recommendations for the adjusting method thereof may be learned according to general knowledge of related technical field, details thereof are not repeated. Moreover, according to an actual circuit design requirement, the oscillator 110 may include or does not include the first current source I1 and the second current source I2. Moreover, the first mutual inductor 112 and the second mutual inductor 114 and the oscillator 110 may be fabricated together in an embedded manner or fabricated separately in an external-coupling manner, which is not limited by the invention.

In the present embodiment, the transistor pair M1, M3 has a first transconductance gm1. The first transconductance gm1 is obtained by calculating a small signal model of the transistor pair M1, M3. The first transconductance gm1 is changed in response to a current value of the first current source I1. The cross-coupled transistor pair M2, M4 has a second transconductance gm2. The second transconductance gm2 is obtained by calculating a small signal model of the cross-coupled transistor pair M2, M4. The second transconductance gm2 is changed in response to a current value of the second current source I2. In the present embodiment, a frequency of the oscillation signal Vosc generated by the oscillator 110 is determined according to the first transconductance gm1 and the second transconductance gm2.

To be specific, in the present embodiment, the frequency of the oscillation signal Vosc is, for example, determined by a following equation:

$$\omega_{osc}^2 = \frac{C - (g_{m1}K + g_{m2})g_{m2}L}{LC^2}$$

Where, ωosc is the frequency of the oscillation signal Vosc, gm1 is the first transconductance, gm2 is the second transconductance, K is a mutual inductance value of the first mutual inductor 112 or a mutual inductance value of the second mutual inductor 114, C is an equivalent capacitance value of a parasitic capacitor of the oscillator 110, and L is a sum of an equivalent inductance value of a parasitic inductor of the oscillator 110 and inductance values of the inductors L1-L4.

In the present embodiment, the cross-coupled transistor pair M2, M4 is magnetically coupled to the transistor pair M1, M3 through the first mutual inductor 112 and the second mutual inductor 114, and the inductance values of the inductors L1-L4 are not changed. Therefore, the frequency of the oscillation signal Vosc generated by the oscillator 110 may be determined by the first transconductance gm1 and the second transconductance gm2. Moreover, in the present embodiment, the oscillator 110 is, for example, a crystal-free oscillator.

In an embodiment of the invention, the current value of at least one of the first current source I1 and the second current source I2 may be adjusted according to an input voltage, so as to correspondingly adjust the first transconductance gm1 and the second transconductance gm2.

Figure 2:
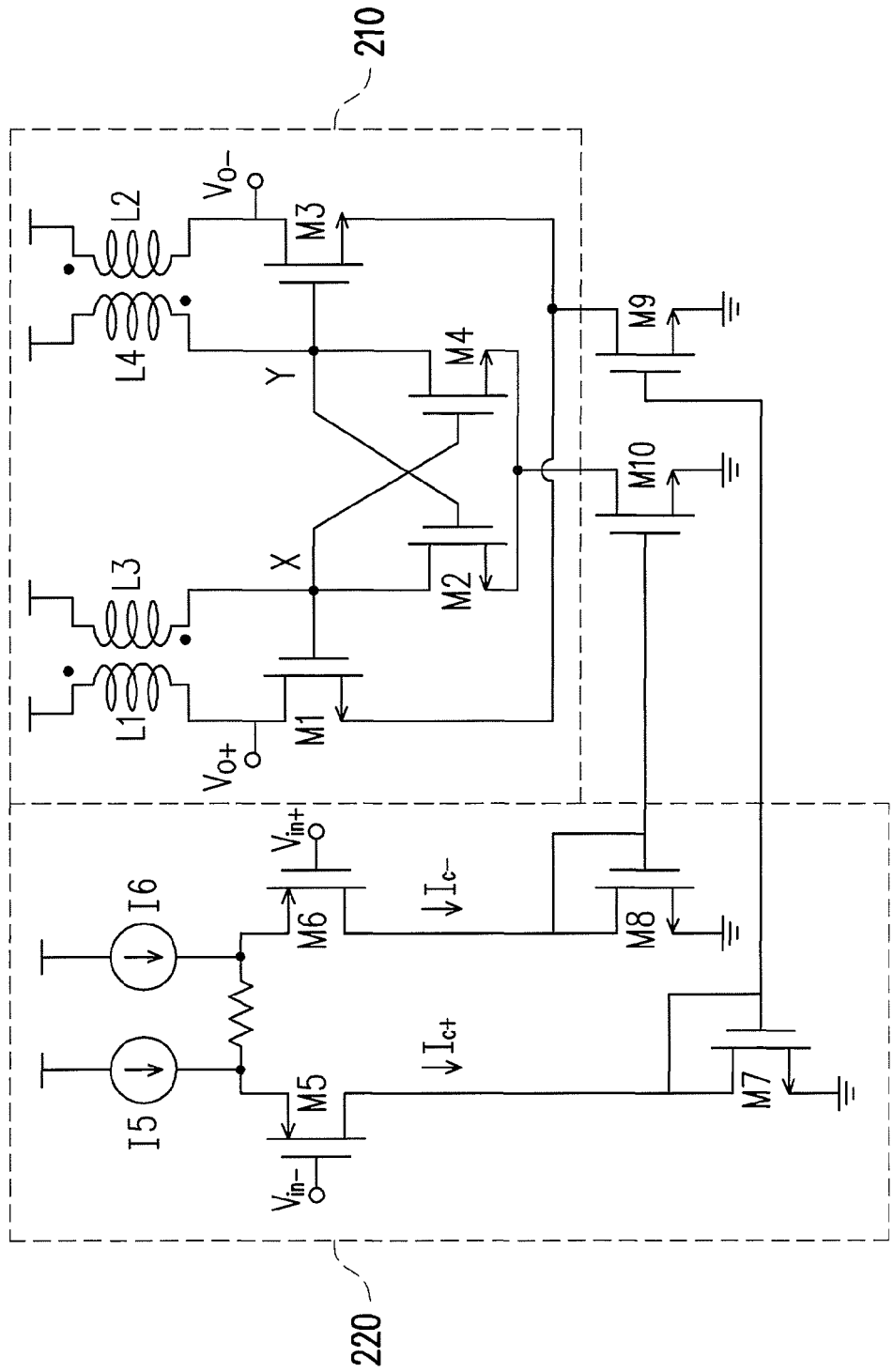
FIG. 2 is a circuit schematic diagram of an oscillator according to another embodiment of the invention.

FIG. 2 is a circuit schematic diagram of an oscillator according to another embodiment of the invention. Referring to FIG. 1 and FIG. 2, the oscillator 210 of the present embodiment is similar to the oscillator 110 of FIG. 1, and a main difference therebetween is that the oscillator 210 is a voltage-controlled oscillator (VCO), which is electrically connected to a voltage control circuit 220.

To be specific, in the present embodiment, the first current source I1 and the second current source I2 are, for example, implemented by current mirror circuits. For example, a combination of transistors M5, M7 and M9 is a first current mirror, which is configured to map a bias current source I5 to the oscillator 210 to serve as the first current source I1. A combination of transistors M6, M7 and M10 is a second current mirror, which is configured to map a bias current source I6 to the oscillator 210 to serve as the second current source I2. In the present embodiment, the transistors M5, M6 serve as an input transistor pair for respectively receiving input voltages from input terminals Vin+ and Vin−. A current Ic+ and a current Ic− respectively drained by the first current mirror and the second current mirror from the bias current source I5 and the bias current source I6 are changed along with different input voltages of the input terminals Vin+ and Vin−, so as to adjust current values mapped to the oscillator 210.

Therefore, in the present embodiment, the voltage control circuit 220 receives the input voltages of the input terminals Vin+ and Vin−, so as to adjust the current values of the first current source I1 and the second current source I2 to change the first transconductance gm1 and the second transconductance gm2. Therefore, the oscillator 210 is, for example, a voltage-controlled oscillator. Moreover, according to an actual circuit design requirement, the oscillator 210 may include or does not include the voltage control circuit 220, which is not limited by the invention. In the present embodiment, although the voltage control circuit 220 is implemented through a double-end input, the invention is not limited thereto. In an embodiment, the voltage controlled circuit 220 may also be a single-end input. In other words, the circuit structure of the voltage control circuit 220 is not limited by the invention. Moreover, since enough instructions and recommendations for the method for determining the frequency of the oscillation signal generated by the oscillator 210 of the present embodiment may be learned from the descriptions of the embodiment of FIG. 1, detailed description thereof is not repeated.

In an embodiment of the invention, a current value of at least one of the first current source I1 and the second current source I2 may be adjusted according to a temperature parameter, so as to correspondingly adjust the first transconductance gm1 or the second transconductance gm2.

Figure 3:
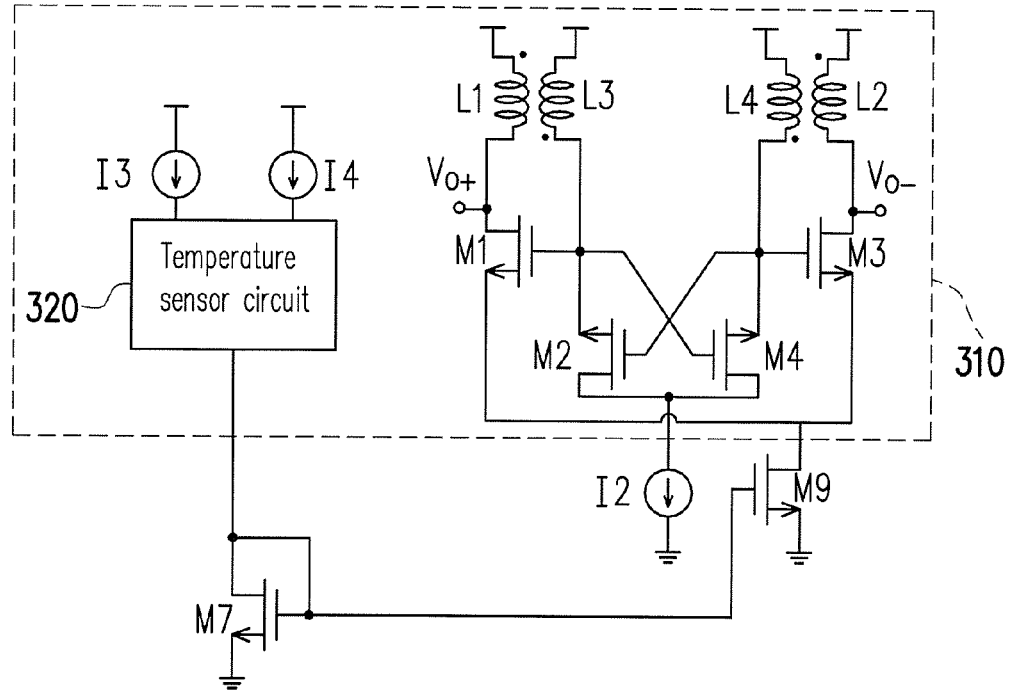
FIG. 3 is a circuit schematic diagram of an oscillator according to another embodiment of the invention.

FIG. 3 is a circuit schematic diagram of an oscillator according to another embodiment of the invention. Referring to FIG. 1 and FIG. 3, the oscillator 310 of the present embodiment is similar to the oscillator 110 of FIG. 1, and a main difference therebetween is that the oscillator 310 includes a temperature sensor circuit 320, so as to compensate an oscillation frequency of the oscillator 310 drifted due to a temperature variation.

To be specific, in the present embodiment, the first current source I1 is, for example, implemented by a current mirror circuit. For example, the current mirror is, for example, a combination of transistors M7 and M9, and is configured to map at least one of a third current source I3 and a fourth current source I4 to the oscillator 310 to serve as the first current source I1. In the present embodiment, the temperature sensor circuit 320 is coupled to the first current source I1 implemented by the current mirror. The temperature sensor circuit 320 is configured to sense a temperature parameter, and adjust a current value of the first current source I1 according to the temperature parameter. In the present embodiment, the third current source I3 and the fourth current source I4 are configured to provide bias currents of the temperature sensor circuit 320. The temperature sensor circuit 320, for example, adjusts the current value of the first current source I1 by using at least one of the third current source I3 and the fourth current source I4. For example, in the present embodiment, the third current source I3 is, for example, a current source proportional to absolute temperature (PTAT). The fourth current source I4 is, for example, a current source complementary to absolute temperature (CTAT). However, the invention is not limited thereto, and in an embodiment, the third current source I3 may also be a current source complementary to absolute temperature, and the fourth current source I4 may also be a current source proportional to absolute temperature.

Therefore, in the present embodiment, the temperature sensor circuit 320 is configured to sense the temperature parameter, and adjust the current value of the first current source I1 according to the temperature parameter, so as to change the first transconductance gm1. Therefore, the temperature sensor circuit 320 may compensate the oscillation frequency of the oscillator 310 drifted due to the temperature variation. Moreover, according to an actual circuit design requirement, the oscillator 310 may include or does not include the temperature sensor circuit 320, the third current source I3 and the fourth current source I4.

In the present embodiment, since enough instructions and recommendations for implementations of the temperature sensor circuit 320, the current source proportional to absolute temperature and the current source complementary to absolute temperature may be learned according to general knowledge of the related technical field, details thereof are not repeated. Moreover, since enough instructions and recommendations for the method for determining the frequency of the oscillation signal generated by the oscillator 310 of the present embodiment may be learned from the descriptions of the embodiment of FIG. 1, detailed description thereof is not repeated.

In an embodiment, although the implementation that the temperature sensor circuit 320 adjusts the current value of the first current source I1 according to the temperature parameter is taken as an example for description, the invention is not limited thereto. In an embodiment, the temperature sensor circuit 320 may also respectively adjust the current values of the first current source I1 and the second current source I2 according to the temperature parameter.

Figure 4:
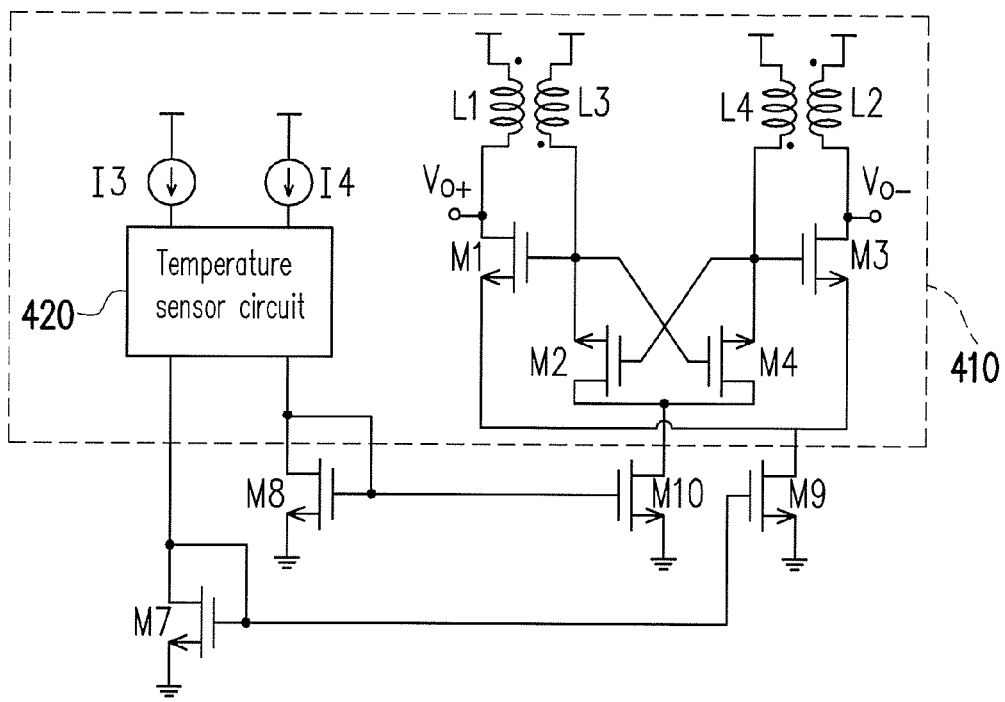
FIG. 4 is a circuit schematic diagram of an oscillator according to another embodiment of the invention.

FIG. 4 is a circuit schematic diagram of an oscillator according to another embodiment of the invention. Referring to FIG. 3 and FIG. 4, the oscillator 410 of the present embodiment is similar to the oscillator 310 of FIG. 3, though a main difference therebetween is that the temperature sensor circuit 420 respectively adjusts the current values of the first current source I1 and the second current source I2 according to the temperature parameter.

To be specific, in the present embodiment, the first current source I1 and the second current source I2 are, for example, respectively implemented by a current mirror circuit. For example, a combination of the transistors M7 and M9 is a first current mirror, which is configured to map one of the third current source I3 and the fourth current source I4 to the oscillator 410 to serve as the first current source I1. A combination of the transistors M8 and M10 is a second current mirror, which is configured to map another one of the third current source I3 and the fourth current source I4 to the oscillator 410 to serve as the second current source I2. In the present embodiment, the temperature sensor circuit 320 is coupled to the first current source I1 implemented by the first current mirror and the second current source I2 implemented by the second current mirror. The temperature sensor circuit 320 is configured to sense a temperature parameter, and adjust the current values of the first current source I1 and the second current source I2 according to the temperature parameter.

Moreover, since enough instructions and recommendations for the method for determining the frequency of the oscillation signal generated by the oscillator 410 of the present embodiment may be learned from the descriptions of the embodiment of FIG. 1, detailed description thereof is not repeated.

In other words, in an exemplary embodiment of the invention, the current value of at least one of the first current source I1 and the second current source I2 may be adjusted according to the temperature parameter, so as to change the first transconductance gm1 and the second transconductance gm2, and accordingly compensate the oscillation frequency of the oscillator drifted due to the temperature variation.

In an embodiment of the invention, the current value of at least one of the first current source I1 and the second current source I2 may be adjusted according to a process parameter, so as to correspondingly adjust the first transconductance gm1 and the second transconductance gm2.

Figure 5:
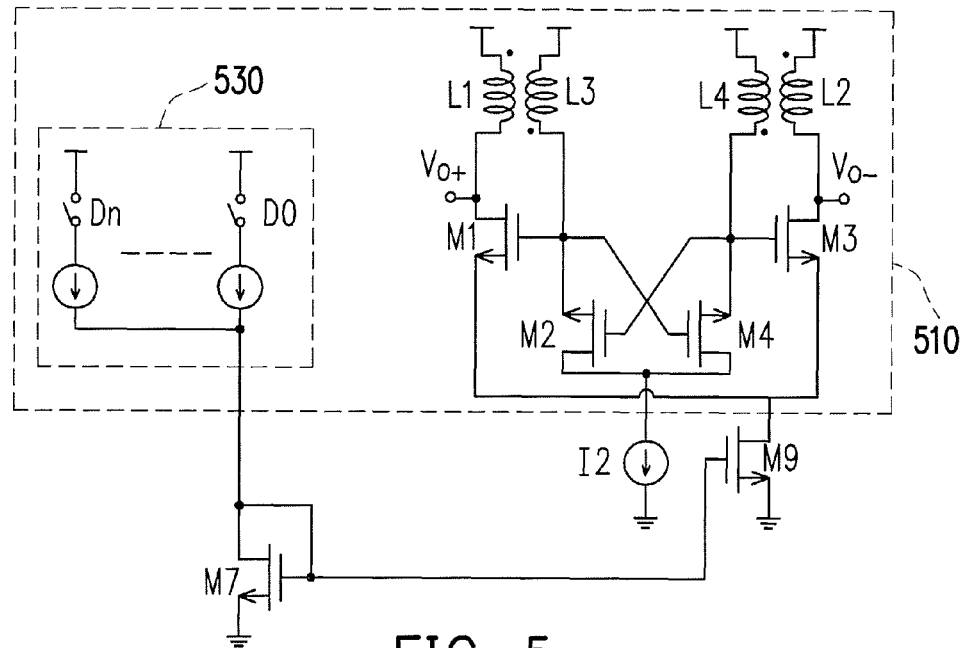
FIG. 5 is a circuit schematic diagram of an oscillator according to another embodiment of the invention.

FIG. 5 is a circuit schematic diagram of an oscillator according to another embodiment of the invention. Referring to FIG. 1 and FIG. 5, the oscillator 510 of the present embodiment is similar to the oscillator 110 of FIG. 1, and a main difference therebetween is that the oscillator 510 includes a compensation circuit 530 to compensate an oscillation frequency of the oscillator 510 drifted due to a process variation.

To be specific, in the present embodiment, the first current source I1 is, for example, implemented by a current mirror circuit. For example, a combination of the transistors M7 and M9 is the current mirror, which is configured to map a current provided by the compensation circuit 530 to the oscillator 510 to serve as the first current source I1. In the present embodiment, the compensation circuit 530 is coupled to the current mirror to implement the first current source I1. The compensation circuit 530 is configured to receive compensation signals D0-Dn, and outputs a compensation current according to the compensation signals D0-Dn, so as to adjust the current value of the first current source I1. In the present embodiment, the compensation circuit 530 includes a plurality of combinations of switches and current sources coupled in series with each other. These combinations are set in parallel, and the number and coupling method thereof are not used for limiting the invention. The switches are turned on/off in response to the compensation signals D0-Dn, so as to conduct a current transmission path. The current sources corresponding to the turned-on switches may provide currents, and a sum of the currents serves as the compensation current, which is output to the current mirror from the compensation circuit 530, so as to adjust the current value of the first current source I1 according to the compensation signals D0-Dn. In the present embodiment, the compensation signals D0-Dn are, for example, signals set according to the process variation, so as to compensate the drifted oscillation frequency.

Therefore, in the present embodiment, the compensation circuit 530 is configured to adjust the current value of the first current source I1 according to a process parameter, so as to change the first transconductance gm1. Therefore, the compensation circuit 530 may compensate the oscillation frequency of the oscillator 510 drifted due to the process variation. Moreover, according to an actual circuit design requirement, the oscillator 510 may include or does not include the compensation circuit 530, which is not limited by the invention.

In the present embodiment, since enough instructions and recommendations for implementation of the compensation circuit 530 may be learned according to general knowledge of related technical field, details thereof are not repeated. Moreover, since enough instructions and recommendations for the method for determining the frequency of the oscillation signal generated by the oscillator 510 of the present embodiment may be learned from the descriptions of the embodiment of FIG. 1, detailed description thereof is not repeated.

In the present embodiment, although the implementation that the compensation circuit 530 adjusts the current value of the first current source I1 according to the process parameter is taken as an example for description, the invention is not limited thereto. In an embodiment, the compensation circuit 530 may also adjust the current value of the second current source I2 according to the process parameter. In an embodiment, the compensation circuit 530 may also respectively adjust the current values of the first current source I1 and the second current source I2 according to the process parameter. In other words, the current value of at least one of the first current source I1 and the second current source I2 may be adjusted according to the process parameter, so as to correspondingly adjust the first transconductance gm1 or the second transconductance gm2.

Figure 6:
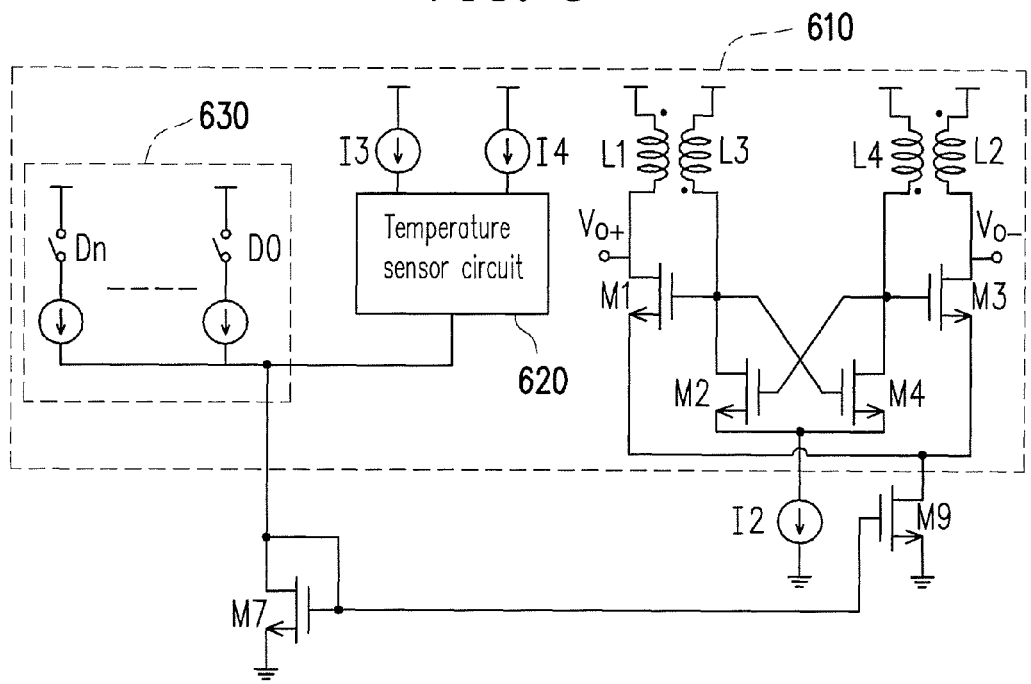
FIG. 6 is a circuit schematic diagram of an oscillator according to another embodiment of the invention.

FIG. 6 is a circuit schematic diagram of an oscillator according to another embodiment of the invention. Referring to FIG. 1 and FIG. 6, the oscillator 610 of the present embodiment is similar to the oscillator 110 of FIG. 1, and a main difference therebetween is that the oscillator 610 includes a temperature sensor circuit 620 and a compensation circuit 630, so as to compensate the oscillation frequency of the oscillator 610 drifted due to a temperature variation and a process variation.

To be specific, in the present embodiment, the first current source I1 is, for example, implemented by a current mirror circuit. For example, a combination of the transistors M7 and M9 is the current mirror, which is configured to map at least one of the third current source I3, the fourth current source I4, a current provided by the compensation circuit 630 to the oscillator 610 to serve as the first current source I1. In the present embodiment, the temperature sensor circuit 620 and the compensation circuit 630 are coupled to the first current source I1 implemented by the current mirror. The temperature sensor circuit 620 and the compensation circuit 630 operate in collaboration to respectively compensate the oscillation frequency of the oscillator 610 drifted due to the temperature variation and the process variation, and since enough instructions and recommendations for the compensation method thereof may be learned from the descriptions of the embodiments of FIG. 3 and FIG. 5, detailed description thereof is not repeated. Moreover, since enough instructions and recommendations for the method for determining the frequency of the oscillation signal generated by the oscillator 610 of the present embodiment may be learned from the descriptions of the embodiment of FIG. 1, detailed description thereof is not repeated.

In the present embodiment, although the implementation that the temperature sensor circuit 620 and the compensation circuit 630 operate in collaboration to adjust the current value of the first current source I1 is taken as an example for description, the invention is not limited thereto. In an embodiment, the temperature sensor circuit 620 and the compensation circuit 630 may also operate in collaboration to adjust the current value of the second current source I2. In an embodiment, the temperature sensor circuit 620 and the compensation circuit 630 may also operate in collaboration to respectively adjust the current values of the first current source I1 and the second current source I2.

Figure 7:
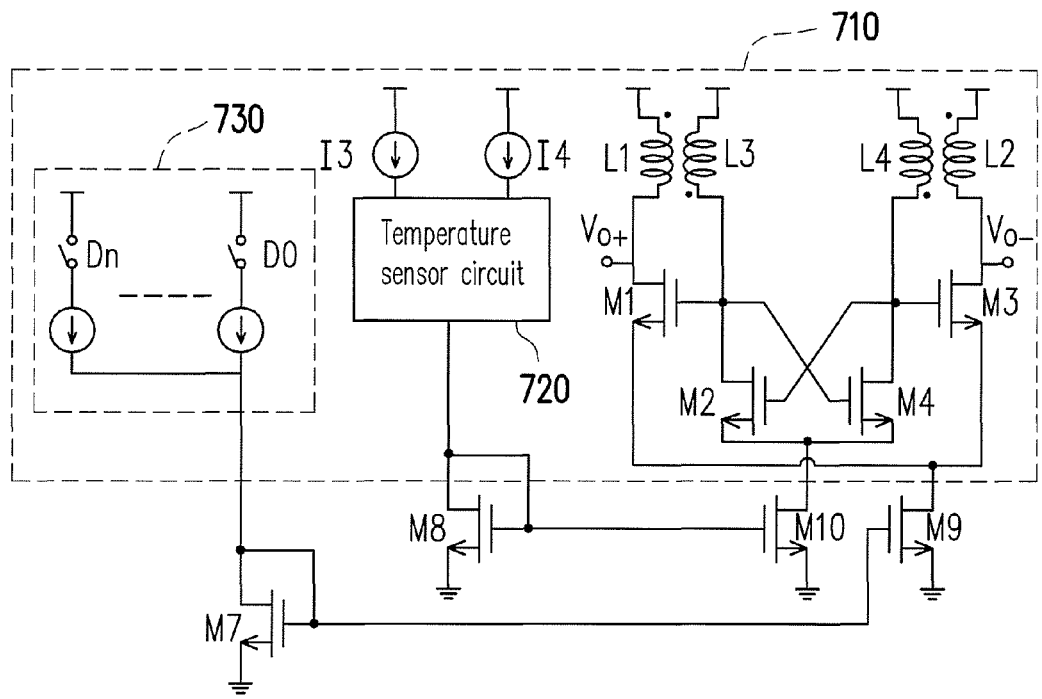
FIG. 7 is a circuit schematic diagram of an oscillator according to another embodiment of the invention.

FIG. 7 is a circuit schematic diagram of an oscillator according to another embodiment of the invention. Referring to FIG. 5 and FIG. 7, the oscillator 710 of the present embodiment is similar to the oscillator 510 of FIG. 5, and a main difference therebetween is that the oscillator 710 further includes a temperature sensor circuit 720, so as to compensate an oscillation frequency of the oscillator 710 drifted due to a temperature variation. In the present embodiment, the temperature sensor circuit 720 and the compensation circuit 730 are, for example, respectively configured to adjust the current values of the second current source I2 and the first current source I1.

To be specific, in the present embodiment, the second current source I2 is, for example, implemented by a current mirror circuit. For example, a combination of the transistors M8 and M10 is another current mirror, which is configured to map at least one of the third current source I3 and the fourth current source I4 to the oscillator 710 to serve as the second current source I2. In the present embodiment, the temperature sensor circuit 720 is coupled to the second current source I2 implemented by the another current mirror. The temperature sensor circuit 720 is configured to sense a temperature parameter, and adjust a current value of the second current source I2 according to the temperature parameter, and since enough instructions and recommendations for the adjusting method thereof may be learned from the descriptions of the embodiment of FIG. 3, detailed description thereof is not repeated.

Moreover, in the present embodiment, since enough instructions and recommendations for the method that the compensation circuit 730 adjusts the current value of the first current source I1 and the method for determining the frequency of the oscillation signal generated by the oscillator 710 of the present embodiment may be learned from the descriptions of the embodiments of FIG. 1 and FIG. 5, detailed description thereof is not repeated.

FIG. 8 is a circuit schematic diagram of a clock generator according to an embodiment of the invention. Referring to FIG. 8, the clock generator 800 of the present embodiment is configured to generate a clock signal CLK. The clock generator 800 includes an oscillator 810. The oscillator 810 is configured to generate an oscillation signal Vosc to serve as the clock signal CLK. In the present embodiment, the oscillator 810 is, for example, the oscillators shown in FIG. 1 to FIG. 7, which is not limited by the invention. In the present exemplary embodiment, the clock generator 800 may further include functional components such as a phase/frequency detector, a charge pump, a loop filter, a control circuit and a feedback circuit, etc., which is not limited by the invention.

Moreover, in the present embodiment, since enough instructions and recommendations for the method that the oscillator 810 generates the oscillation signal and the method for determining the frequency of the oscillation signal generated by the oscillator 810 may be learned from the descriptions of the embodiments of FIG. 1 to FIG. 7, detailed description thereof is not repeated.

Figure 9:
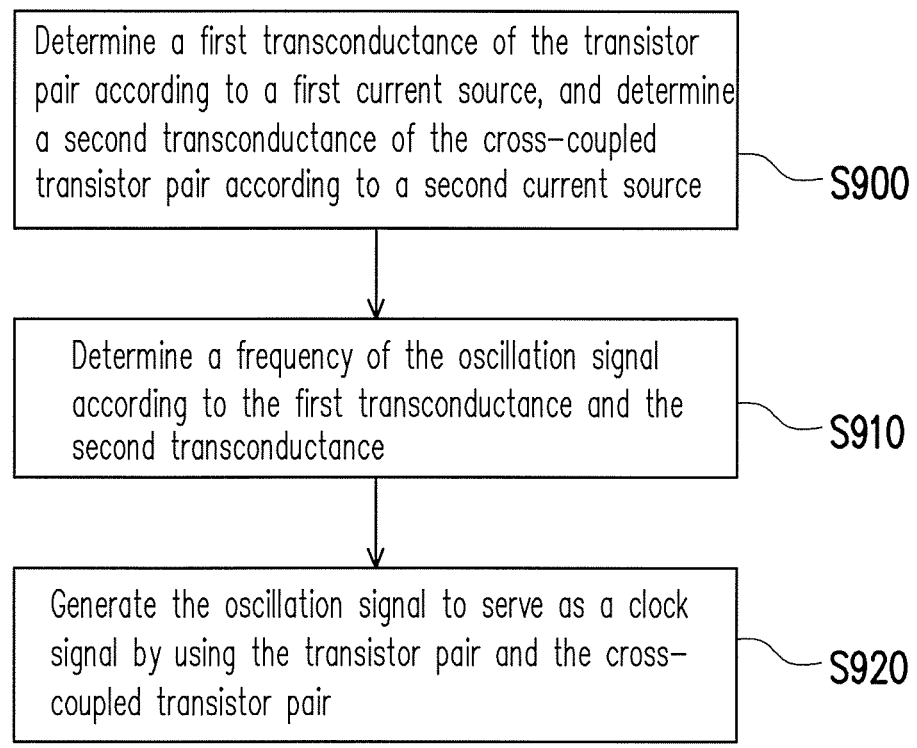
FIG. 9 is a flowchart illustrating a method for generating a clock signal according to an embodiment of the invention.

FIG. 9 is a flowchart illustrating a method for generating a clock signal according to an embodiment of the invention. Referring to FIG. 1, FIG. 8 and FIG. 9, the method for generating the clock signal of the present embodiment may be applied to the clock generator 800 of FIG. 8 for controlling the oscillator 810 to generate the oscillation signal Vosc to serve as the clock signal CLK, though the invention is not limited thereto.

To be specific, in step S900, the oscillator 810 determines the first transconductance gm1 of the transistor pair according to the first current source I1, and determines the second transconductance gm2 of the cross-coupled transistor pair according to the second current source I2. Then, in step S910, the oscillator 810 determines a frequency of the oscillation signal Vosc according to the first transconductance gm1 and the second transconductance gm2. Then, in step S920, the oscillator 810 generates the oscillation signal Vosc to serve as the clock signal CLK of the clock generator 800 by using the transistor pair M1, M3 and the cross-coupled transistor pair M2, M4. In the present embodiment, the current value of at least one of the first current source I1 and the second current source I2 may be adjusted according to one of the input voltage, the temperature parameter and the process parameter, so as to compensate the oscillation frequency drifted due to the temperature variation and the process variation.

Moreover, in the present embodiment, since enough instructions and recommendations for the method for generating the clock signal may be learned from the descriptions of the embodiments of FIG. 1 to FIG. 8, detailed description thereof is not repeated.

In summary, in the exemplary embodiments of the invention, the oscillator is configured to output an oscillation signal, which is used in the clock generator to serve as a clock signal. A frequency of the oscillation signal may be drifted due to an influence of factors such as temperature variation, process variation or electromagnetic interference, etc. In the exemplary embodiments of the invention, the inductors in the oscillator may have a mutual induction effect to couple the transistor pair and the cross-coupled transistor pair, such that the transconductance of at least one of the transistor pair and the cross-coupled transistor pair may be changed in response to the current value of the current source coupled thereto. Then, in the exemplary embodiment of the invention, by using the temperature sensor circuit to sense the temperature parameter or using the compensation circuit to set the compensation current corresponding to the process parameter, the current source coupled to at least one of the transistor pair and the cross-coupled transistor pair may be adjusted, so as to compensate the oscillation frequency drifted due to the temperature variation or the process variation.

It will be apparent to those skilled in the art that various modifications and variations may be made to the structure of the invention without departing from the scope or spirit of the invention. In view of the foregoing, it is intended that the invention cover modifications and variations of this invention provided they fall within the scope of the following claims and their equivalents.

What is claimed is:

1. An oscillator, configured to generate an oscillation signal, and the oscillator comprising:
    a transistor pair, coupled to a first current source, wherein the transistor pair has a first transconductance, and the first transconductance is changed in response to a current value of the first current source;
    a cross-coupled transistor pair, coupled to a second current source, wherein the cross-coupled transistor pair has a second transconductance, the second transconductance is changed in response to a current value of the second current source, the transistor pair and the cross-coupled transistor pair are mutually coupled through a plurality of inductors; and
    a temperature sensor circuit, coupled to at least one of the first current source and the second current source, configured to sense a temperature parameter, and adjusting the current value of at least one of the first current source and the second current source according to the temperature parameter,
    wherein a frequency of the oscillation signal is determined according to the first transconductance and the second transconductance.

2. The oscillator as claimed in claim 1, wherein the oscillator is a crystal-free oscillator.

3. The oscillator as claimed in claim 1, wherein the oscillator is a voltage-controlled oscillator configured to generate the oscillation signal according to an input voltage,
    wherein the current value of at least one of the first current source and the second current source is adjusted according to the input voltage.

4. The oscillator as claimed in claim 1, wherein the inductors comprise a first inductor and a second inductor, and the transistor pair comprises:
    a first transistor, having a first terminal, a second terminal and a control terminal, wherein the first terminal is coupled to the first inductor, the second terminal is coupled to the first current source, and the control terminal is coupled to the cross-coupled transistor pair; and
    a second transistor, having a first tenninal, a second terminal and a control terminal, wherein the first terminal is coupled to the second inductor, the second terminal is coupled to the first current source, and the control terminal is coupled to the cross-coupled transistor pair,
    wherein at least one of the first terminal of the first transistor and the first terminal of the second transistor serves as an output terminal, and the voltage-controlled oscillator outputs the oscillation signal through the output terminal.

5. The oscillator as claimed in claim 4, wherein the inductors further comprise a third inductor and a fourth inductor, and the cross-coupled transistor pair comprises:
    a third transistor, having a first terminal, a second terminal and a control terminal, wherein the first terminal is coupled to the third inductor and the control terminal of the first transistor, and the second terminal is coupled to the second current source; and
    a fourth transistor, having a first terminal, a second teniinal and a control terminal, wherein the first terminal is coupled to the fourth inductor and the control terminal of the second transistor, and the second terminal is coupled to the second current source,
    wherein the control terminal of the third transistor is coupled to the first terminal of the fourth transistor, and the control terminal of the fourth transistor is coupled to the first terminal of the third transistor.

6. The oscillator as claimed in claim 5, wherein the first inductor and the third inductor form a first mutual inductor, the second inductor and the fourth inductor form a second mutual inductor, and the first mutual inductor and the second mutual inductor are physically isolated.

7. The oscillator as claimed in claim 1, wherein the temperature sensor circuit adjusts the current value of at least one of the first current source and the second current source by using at least one of a third current source and a fourth current source.

8. The oscillator as claimed in claim 7, wherein the third current source is selected from one of a current source proportional to absolute temperature (PTAT) and a current source complementary to absolute temperature (CTAT), and the fourth current source is selected from another one of the current source proportional to absolute temperature and the current source complementary to absolute temperature.

9. The oscillator as claimed in claim 1, wherein the current value of at least one of the first current source and the second current source is adjusted according to a process parameter.

10. The oscillator as claimed in claim 9, further comprising:
    a compensation circuit, coupled to at least one of the first current source and the second current source, configured to receive a compensation signal, and outputting a compensation current according to the compensation signal, so as to adjust the current value of at least one of the first current source and the second current source.

11. A clock generator, configured to generate a clock signal, the clock generator comprising:
   the oscillator as claimed in claim 1, configured to generate the oscillation signal to serve as the clock signal.

12. A method for generating a clock signal, configured to control an oscillator to generate an oscillation signal to serve as the clock signal, wherein the oscillator comprises a transistor pair and a cross-coupled transistor pair, the method for generating the clock signal comprises:
   determining a first transconductance of the transistor pair according to a first current source, and determining a second transconductance of the cross-coupled transistor pair according to a second current source;
   determining a frequency of the oscillation signal according to the first transconductance and the second transconductance; and
   generating a temperature parameter, and adjusting a current value of at least one of the first cuiTent source and the second current source according to the temperature parameter,
   wherein the transistor pair and the cross-coupled transistor pair are mutually coupled through a plurality of inductors, the transistor pair is coupled to the first current source, the first transconductance is changed in response to the current value of the first current source, the cross-coupled transistor pair is coupled to the second current source, and the second transconductance is changed in response to the current value of the second current source.

13. The method for generating the clock signal as claimed in claim 12, wherein the oscillator is a crystal-free oscillator.

14. The method for generating the clock signal as claimed in claim 12, wherein the oscillator is a voltage-controlled oscillator configured to generate the oscillation signal according to an input voltage,
   wherein the step of determining the first transconductance of the transistor pair according to the first current source, and determining the second transconductance of the cross-coupled transistor pair according to the second current source comprises:
      adjusting the current value of at least one of the first current source and the second current source according to the input voltage, so as to correspondingly change at least one of the first transconductance of the transistor pair and the second transconductance of the cross-coupled transistor pair.

15. The method for generating the clock signal as claimed in claim 14, wherein the step of adjusting the current value of at least one of the first current source and the second current source according to the input voltage, so as to correspondingly change at least one of the first transconductance of the transistor pair and the second transconductance of the cross-coupled transistor pair comprises at least one of two following steps:
   adjusting the current value of the first current source, so as to change the first transconductance of the transistor pair; and
   adjusting the current value of the second current source, so as to change the second transconductance of the cross-coupled transistor pair.

16. The method for generating the clock signal as claimed in claim 12, wherein the inductors comprise a first inductor, a second inductor, a third inductor and a fourth inductor, the first inductor and the third inductor form a first mutual inductor, and the second inductor and the fourth inductor form a second mutual inductor, and the first mutual inductor and the second mutual inductor are physically isolated.

17. The method for generating the clock signal as claimed in claim 12,
   wherein at least one of a third current source and a fourth current source is used to adjust the current value of at least one of the first current source and the second current source according to the temperature parameter.

18. The method for generating the clock signal as claimed in claim 17, wherein the third current source is selected from one of a current source proportional to absolute temperature (PTAT) and a current source complementary to absolute temperature (CTAT), and the fourth current source is selected from another one of the current source proportional to absolute temperature and the current source complementary to absolute temperature.

19. The method for generating the clock signal as claimed in claim 12, further comprising:
   receiving a compensation signal, and outputting a compensation current according to the compensation signal, so as to adjust the current value of at least one of the first current source and the second current source.

* * * * *